United States Patent
Yang et al.

(10) Patent No.: US 10,714,680 B2
(45) Date of Patent: Jul. 14, 2020

(54) LARGE HEIGHT TREE-LIKE SUB 30NM VIAS TO REDUCE CONDUCTIVE MATERIAL RE-DEPOSITION FOR SUB 60NM MRAM DEVICES

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/113,088

(22) Filed: Aug. 27, 2018

(65) Prior Publication Data
US 2020/0066973 A1 Feb. 27, 2020

(51) Int. Cl.
| H01L 43/12 | (2006.01) |
| G11C 11/16 | (2006.01) |
| H01L 43/02 | (2006.01) |
| H01L 43/08 | (2006.01) |
| H01F 41/34 | (2006.01) |
| H01F 10/32 | (2006.01) |
| H01L 27/22 | (2006.01) |

(52) U.S. Cl.
CPC ......... *H01L 43/12* (2013.01); *H01F 10/3254* (2013.01); *H01F 41/34* (2013.01); *H01L 43/02* (2013.01); *G11C 11/161* (2013.01); *H01L 27/222* (2013.01)

(58) Field of Classification Search
CPC .......... H01L 21/76877; H01L 23/5226; H01L 23/528; H01L 27/222; H01L 27/228; H01L 43/02; H01L 43/08; H01L 43/12
See application file for complete search history.

(56) References Cited

U.S. PATENT DOCUMENTS

| 8,324,698 | B2 | 12/2012 | Zhong et al. | |
| 10,418,547 | B1* | 9/2019 | Yang | ...................... H01F 41/308 |
| 2017/0125668 | A1* | 5/2017 | Paranjpe | ................. H01L 43/12 |
| 2018/0040668 | A1* | 2/2018 | Park | ....................... G11C 11/161 |
| 2019/0312197 | A1* | 10/2019 | Yang | ........................ H01L 43/12 |

* cited by examiner

*Primary Examiner* — David C Spalla
(74) *Attorney, Agent, or Firm* — Hayne and Boone LLP

(57) ABSTRACT

A stack of connecting metal vias is formed on a bottom electrode by repeating steps of depositing a conductive via layer, patterning and trimming the conductive via layer to form a sub 30 nm conductive via, encapsulating the conductive via with a dielectric layer, and exposing a top surface of the conductive via. A MTJ stack is deposited on the encapsulated via stack. A top electrode layer is deposited on the MTJ stack and patterned and trimmed to form a sub 60 nm hard mask. The MTJ stack is etched using the hard mask to form an MTJ device and over etched into the encapsulation layers but not into the bottom electrode wherein metal re-deposition material is formed on sidewalls of the encapsulation layers underlying the MTJ device and not on sidewalls of a barrier layer of the MTJ device.

20 Claims, 2 Drawing Sheets

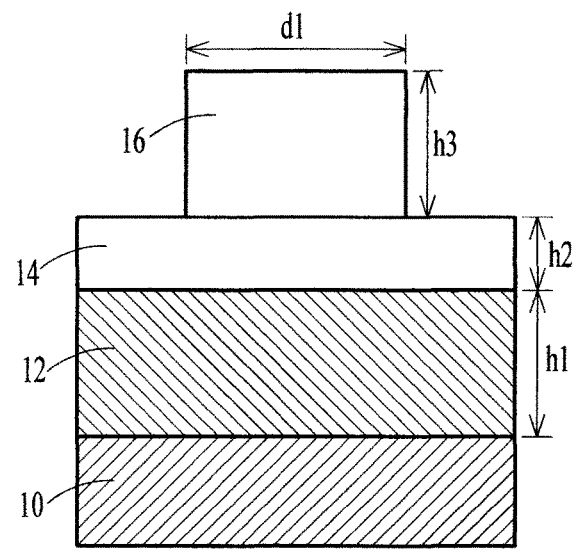
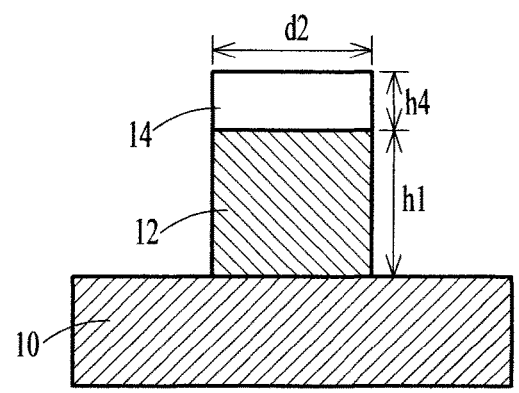
Figure 1
Figure 2
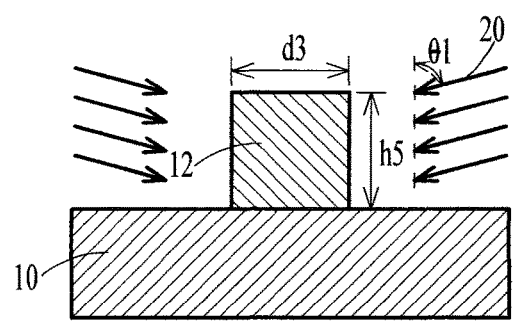
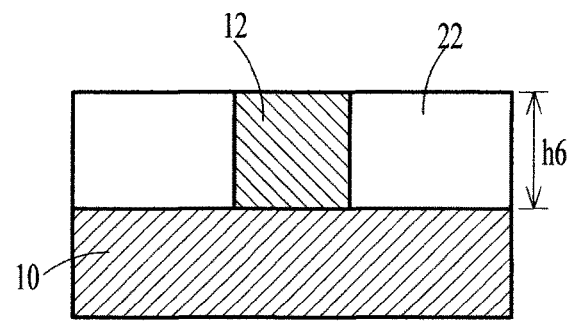
Figure 3
Figure 4

LARGE HEIGHT TREE-LIKE SUB 30NM VIAS TO REDUCE CONDUCTIVE MATERIAL RE-DEPOSITION FOR SUB 60NM MRAM DEVICES

RELATED PATENT APPLICATION

This application is related to co-pending U.S. patent application Ser. No. 16/133,955 filed on Sep. 18, 2018, assigned to the same assignee as the present application and herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance. To solve this issue, pure physical etching techniques such as pure Ar RIE or ion beam etching (IBE) have been applied to etch the MTJ stack.

However, due to the non-volatile nature, pure physically etched conductive materials in the MTJ and bottom electrode can form a continuous path across the tunnel barrier, resulting in shorted devices. One solution to this is to form dielectric surrounded vias smaller than the MTJ connecting the MTJ and bottom electrode. This allows for a great over etch of the MTJ so that the metal re-deposition from the MTJ itself can be limited below the tunnel barrier; meanwhile, re-deposition from the bottom electrode is completely avoided. However, the via height, which represents the spacing between the MTJ and bottom electrode, is usually <50 nm, limited by the poor etch selectivity between the photoresist and via material. A new approach to further increase the via height is required if a greater MTJ over etch is needed to further reduce the metal re-deposition.

Several references teach over etching to form MTJ's, including U.S. Patent Applications 2018/0040668 (Park et al) and 2017/0125668 (Paranipe et al). Other references teach thin vias on wider metal layers, such as U.S. Pat. No. 8,324,698 (Zhong et al). All of these references are different from the present disclosure.

SUMMARY

It is an object of the present disclosure to provide an improved method of forming MTJ structures.

Yet another object of the present disclosure is to provide a method of forming MTJ devices using a physical over etch to avoid both chemical damage and physical shorts.

A further object of the present disclosure is to provide a method of forming MTJ devices using a physical over etch into a dielectric layer encapsulating stacked metal vias on a bottom electrode to avoid both chemical damage and physical shorts.

In accordance with the objectives of the present disclosure, a method for etching a magnetic tunneling junction (MTJ) structure is achieved. A stack of connecting metal vias is formed on a bottom electrode by repeating steps of depositing a conductive via layer, patterning and trimming the conductive via layer to form a sub 30 nm conductive via, encapsulating the conductive via with a dielectric layer, and exposing a top surface of the conductive via to form a stack of connecting metal vias. A MTJ stack is deposited on the encapsulated via stack wherein the MTJ stack comprises at least a pinned layer, a barrier layer on the pinned layer, and a free layer on the barrier layer. A top electrode layer is deposited on the MTJ stack and patterned and trimmed to form a sub 60 nm hard mask. The MTJ stack is etched using the hard mask to form an MTJ device and over etched into the encapsulation layers but not into the bottom electrode wherein metal re-deposition material is formed on sidewalls of the encapsulation layers underlying the MTJ device and not on sidewalls of a barrier layer of the MTJ device.

BRIEF DESCRIPTION OF THE DRAWINGS

In the accompanying drawings forming a material part of this description, there is shown:

FIGS. 1 through 7 illustrate in cross-sectional representation steps in a preferred embodiment of the present disclosure.

DETAILED DESCRIPTION

Figure 5:
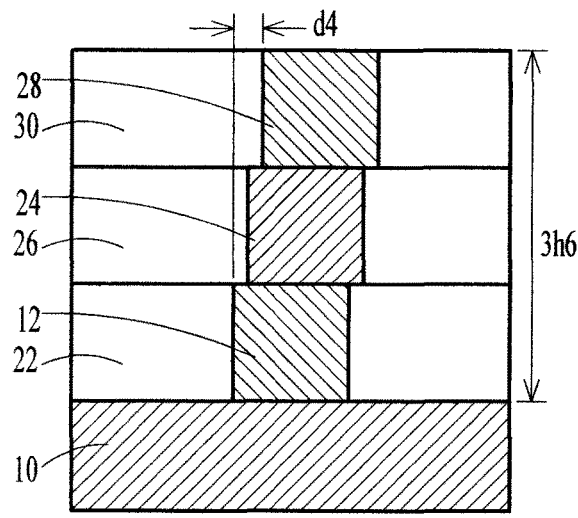

In the process of the present disclosure, we introduce large height tree-like sub 30 nm vias by repeatedly stacking one layer of high angle IBE trimmed vias onto another. Later an MTJ stack is deposited and over etched into the dielectric underneath to simultaneously reduce the conductive metal re-deposition from the MTJ itself and to avoid the conductive metal re-deposition from the bottom electrode. Here a middle angle (30-60°) IBE is used, forming tapered MTJ/dielectric patterns without chemical damage. These tapered patterns with larger bottom critical dimension (CD) than top ensures that the vias underneath are not touched during this step, even if there is an overlay shift while patterning these vias.

In a prior process flow, the MTJ stack is patterned on top of one single layer of IBE trimmed metal via with height <50 nm. The allowed amount of MTJ over etch is not enough to completely remove the metal re-deposition on the tunnel barrier. However, in the process of the present disclosure, by repeatedly stacking one layer of vias onto another and later etching the MTJ by a middle angle IBE, we can greatly over etch the MTJ into the dielectric without touching the vias underneath. In other words, the original via height limit no longer exists. It thus becomes possible to completely eliminate the electrically shorted devices from metal re-deposition.

Referring now to FIGS. 1 through 7, the novel method of the present disclosure will be described in detail. Referring now more particularly to FIG. 1, there is shown a bottom electrode 10 formed on a substrate, not shown. Now, a metal layer 12 for forming a via, such as Ta, TaN, Ti, TiN, W, Cu, Mg, Ru, Cr, Co, Fe, Ni, Pt, Ir, Mo, or their combinations such as TiN/Co/Ir, TiN/TiN/Ir, etc. with thickness h1 of 10-100 nm, and preferably ≥50 nm, is deposited onto the bottom electrode 10, which may be made of similar materials. A dielectric hard mask 14 such as $SiO_2$, SiN, SiON, SiC or SiCN with thickness h2 of ≥20 nm is then deposited on the metal layer 12. Photoresist is spin-coated and patterned by 248 nm photolithography, forming patterns 16 with size d1 of ~70-80 nm and height h3 of ≥200 nm.

The dielectric hard mask 14 and metal 12 are etched by RIE using fluorine carbon or chlorine based plasma such as $CF_4$, $CHF_3$, or $Cl_2$ alone, or mixed with Ar and $N_2$. $O_2$ can be added to reduce the pillar size further. They can also be patterned by a physical etch such as IBE. Depending on the thickness of the metal layer 12, the dielectric hard mask 14 can be partially consumed, with a thickness now h4 of ≥15 nm. As shown in FIG. 2, the remaining metal thickness is still h1 (≥0.50 nm) with pattern size d2 (—50-60 nm).

Next, as illustrated in FIG. 3, with a high angle IBE trimming 20 such as 70-90° with respect to the surface's normal line, the metal pattern decreases to d3, which can range from 10-40 nm, depending on the IBE trimming conditions such as RF power (500-1000 W) and time (100-500 sec). Here, ex-situ IBE trimming is used when the metal vias are made of inert metals and in-situ IBE trimming is needed for metals that can be readily oxidized in air. Due to the protection of the remaining dielectric 14 on top and the extremely low vertical etch rate (≤5 Å/sec) of IBE at such a large angle, the remaining via's height h5 is the same as the as-deposited height h1 or decreases less than 5 nm after this step.

Next, referring to FIG. 4, a second dielectric material 22 such as $SiO_2$, SiN, SiON, SiC, or SiCN with thickness ≥50 nm is deposited by physical vapor deposition (PVD), chemical vapor deposition (CVD), or atomic layer deposition (ALD) to encapsulate the vias 12. Here, ex-situ encapsulation is used when the metal vias are made of inert metals and in-situ encapsulation is needed for metals that can be readily oxidized in air. CMP is applied to smooth the surface as well as expose the metal vias underneath, with remaining via height h6 of ≥45 nm.

Next, by repeating these steps, one can build multiple layers of these small size vias onto each other. For example, FIG. 5 illustrates via 24 contacting via 22 and encapsulated by dielectric 26 and via 28 contacting via 24 and encapsulated by dielectric 30. The total height of these vias is dependent on how many layers are stacked, which is determined by the required amount of layer MTJ over etch to completely remove the metal re-deposition. For example, in FIG. 5, the total height of the vias is 3h6, three times the via height h6 of ≥45 nm. It should be noted that while building multiple layers of vias, there could be an overlay shift d4 ranging from 0-20 nm at random directions, as shown in FIG. 5. The dielectric encapsulation of the stacked vias makes possible the later MTJ over etch without etching the bottom electrode.

Figure 6:
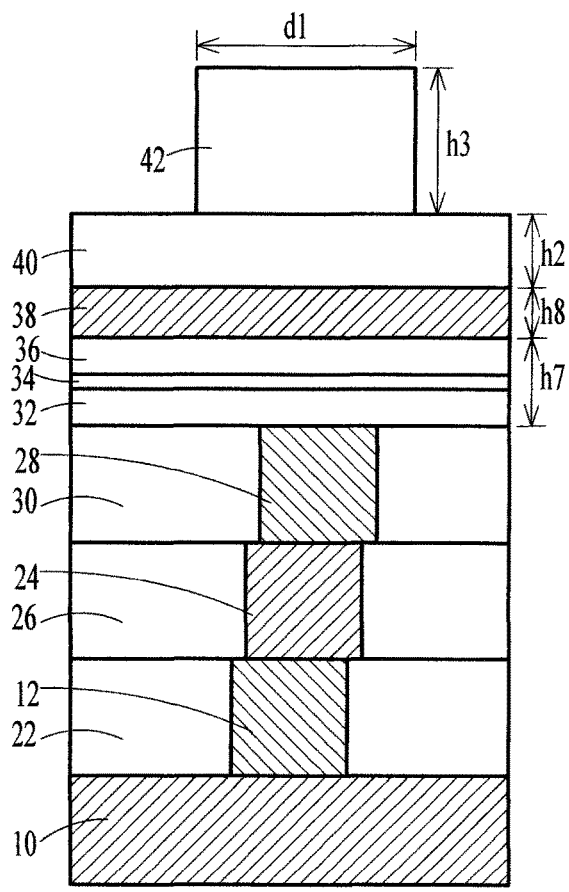

Now, layers are deposited on the encapsulated via stack to form magnetic tunnel junctions, as illustrated in FIG. 6. For example, pinned layer 32, tunnel barrier layer 34, and free layer 36 are deposited. There may be one or more pinned, barrier, and/or free layers. The MTJ layers have a height h7 of 10-30 nm. A top electrode 38 made of similar material to the vias with thickness h8 of 10-100 nm and preferably ≥50 nm is deposited on the MTJ layers. A second dielectric hard mask 40 is deposited on the top electrode 38 with a height ≥20 nm, followed by photoresist coating, exposure, and development to form photoresist patterns 42 with size d1 of ~70-80 nm and height h3 of ≥200 nm.

Figure 7:
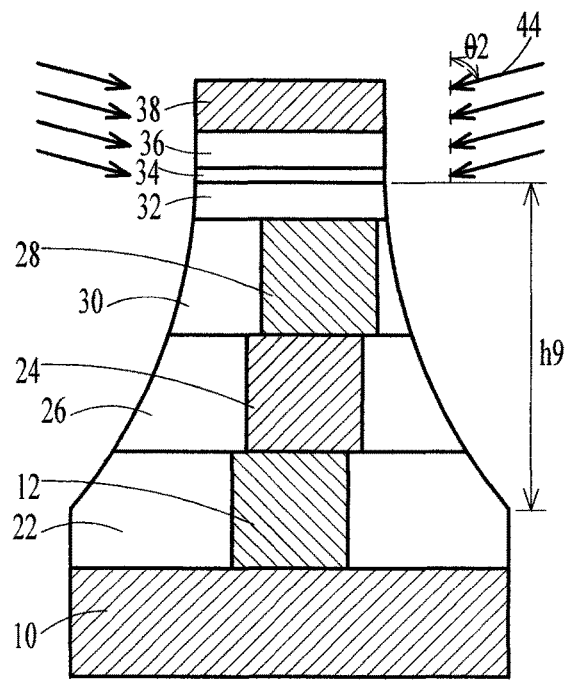

The dielectric hard mask 40 and top electrode 38 are etched by fluorine carbon or chlorine based plasma such as $CF_4$ or $Cl_2$ alone, or mixed with Ar and $N_2$. $O_2$ can be added to further reduce the pillar size. The dielectric hard mask and top electrode can also be etched by pure physical RIE or IBE. Now, as shown in FIG. 7, while etching the MTJ stack with a middle angle IBE 44 ranging from 30-60° with a great over etch into the dielectric layers 30/26/22, a tapered MTJ/dielectric profile is formed. One can increase this tapered angle by increasing the IBE etch angle, according to the required total via height and associated overlay shift, thus ensuring that the vias 28/24/12 with shifted overlay underneath are not touched during this step. The effective height of these tree-like vias is greatly enhanced by this method, allowing for a great MTJ over etch to push the re-deposition from the MTJ downward below the tunnel barrier layer 34 so that electrically shorted devices are greatly reduced using this approach.

In the process of the present disclosure, it is demonstrated that by repeatedly stacking one high angle ion beam etching (IBE) trimmed metal via onto another, we can create large height tree-like sub 30 nm vias which are surrounded by dielectric and connect to the bottom electrode below and sub 60 nm MTJ above. The MTJ stack is later etched using IBE, a physical type of etch to avoid chemical damage. During this step, a middle angle is used, resulting in a tapered MTJ profile, i.e., larger bottom CD than top. This ensures that the vias underneath are not touched during the MTJ over etch even though these vias' overlay is shifted during photolithography. This great over etch of the MTJ into the dielectric greatly reduces the conductive materials re-deposition onto the tunnel barrier from the MTJ itself and completely eliminates re-deposition from the bottom electrode, thus reducing the electrically shorted devices.

In summary, the process of the present disclosure allows for a much greater MTJ over etch, offering the potential to completely eliminate the metal re-deposition induced electrically shorted devices. Moreover, it creates these large height sub 30 nm vias using angled IBE, a much lower cost technique, which would otherwise have to involve the complex and expensive immersion 193 nm or EUV photolithograpy. The process of the present disclosure will be used for MRAM chips of the size smaller than 60 nm as problems associated with chemically damaged sidewall and re-deposition from bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure comprising:
    forming a conductive via stack on a bottom electrode comprising repeating steps of:
    depositing a conductive via layer;
    patterning said conductive via layer and then trimming said conductive layer to form a sub 30 nm first conductive via; and
    encapsulating said conductive via with a dielectric layer and planarizing said dielectric layer to expose a top surface of said conductive via to form a stack of encapsulated conductive vias;
    thereafter depositing a MTJ stack on said stack of encapsulated conductive vias wherein said MTJ stack comprises at least a pinned layer, a barrier layer on said pinned layer, and a free layer on said barrier layer;

depositing a top electrode layer on said MTJ stack;

patterning said top electrode layer and then trimming said top electrode layer to form a sub 60 nm hard mask; and thereafter etching said MTJ stack using said hard mask to form a MTJ device and over etching said MTJ stack into said dielectric layers but not into said bottom electrode wherein any metal re-deposition material is formed on sidewalls of said dielectric layers underlying said MTJ device and not on sidewalls of a barrier layer of said MTJ device.

2. The method according to claim 1 wherein said bottom electrode, said conductive via layers, and said top electrode layer comprise Ta, TaN, Ti, TiN, W, Cu, Mg, Ru, Cr, Co, Fe, Ni, Pt, Jr, Mo, or their combinations with height of 10-100 nm, and preferably ≥50 nm.

3. The method according to claim 1 wherein said patterning said conductive via layer comprises:

depositing a dielectric hard mask comprising $SiO_2$, SiN, SiON, SiC or SiCN to a thickness of ≥20 nm on said conductive via layer;

spin-coating a photoresist layer on said dielectric hard mask;

patterning said photoresist layer to form photoresist patterns with width of 70-80 nm and height of ≥200 nm; and etching said dielectric hard mask and said conductive via layer with RIE using fluorine carbon or chlorine based plasma alone, or mixed with Ar and $N_2$ or with a physical etch using IBE or RIE with Ar plasma to form metal pillars with height ≥50 nm and width 50-60 nm.

4. The method according to claim 1 wherein said trimming said conductive via layer comprises in-situ or ex-situ IBE trimming at an angle of 70-90° with respect to a normal line of a top surface of said conductive via layer with radio frequency (RF) power of 500-1000 W for 100-500 seconds wherein a pattern size of trimmed said conductive via is ≤30 nm.

5. The method according to claim 4 wherein a vertical etch rate of said IBE trimming is ≤5Å/sec wherein a height of conductive via is the same as a height of as-deposited said conductive via layer or said height of said conductive via decreases by less than 5 nm from said as-deposited height.

6. The method according to claim 1 wherein said encapsulating said conductive via with said dielectric layer comprises in-situ or ex-situ depositing $SiO_2$, SiN, SiON, SiC, or SiCN having a thickness of ≥50 nm.

7. The method according to claim 1 wherein said patterning said top electrode layer comprises:

depositing a top dielectric hard mask comprising $SiO_2$, SiN, SiON, SiC or SiCN to a thickness of ≥20 nm on said top electrode layer;

spin-coating a photoresist layer on said top dielectric hard mask;

patterning said photoresist layer to form photoresist patterns with width of 70-80 nm and height of ≥200 nm; and etching said top dielectric hard mask and said top electrode layer with RIE using fluorine carbon or chlorine based plasma alone, or mixed with Ar and $N_2$ or with a physical etch using IBE or RIE with Ar plasma to form metal pillars with height ≥50 nm and width 50-60 nm.

8. The method according to claim 1 wherein said etching and said over etching said MTJ stack comprises physical etching with IBE at an angle of 30-60° with respect to a normal line of a top surface of said MTJ stack wherein said MTJ device and said dielectric layers have a tapered profile wherein a top width is smaller than a bottom width.

9. A method for fabricating a magnetic tunneling junction (MTJ) structure comprising:

depositing a first conductive via layer on a bottom electrode;

patterning said first conductive via layer and then trimming said first conductive layer to form a sub 30 nm first conductive via on said bottom electrode;

encapsulating said first conductive via with a first dielectric layer and planarizing said first dielectric layer to expose a top surface of said first conductive via;

thereafter repeating steps of depositing a subsequent conductive via layer, patterning and trimming said subsequent conductive via layer to form a sub 30 nm subsequent conductive via, encapsulating said subsequent conductive via with a subsequent dielectric layer, and exposing a top surface of said subsequent conductive via to form a stack of encapsulated subsequent conductive vias on said first conductive via;

thereafter depositing a MTJ stack on said stack of encapsulated subsequent conductive vias wherein said MTJ stack comprises at least a pinned layer, a barrier layer on said pinned layer, and a free layer on said barrier layer;

depositing a top electrode layer on said MTJ stack;

patterning said top electrode layer and then trimming said top electrode layer to form a sub 60 nm hard mask; and thereafter ion beam etching said MTJ stack using said hard mask and over etching said MTJ stack into said dielectric layers but not into said bottom electrode at an angle of 30-60° with respect to a normal line of a top surface of said MTJ stack to form an MTJ device wherein any metal re-deposition material is formed on sidewalls of said dielectric layers underlying said MTJ device and not on sidewalls of a barrier layer of said MTJ device.

10. The method according to claim 9 wherein said bottom electrode, said first conductive via layer, said subsequent conductive via layers, and said top electrode layer comprise Ta, TaN, Ti, TiN, W, Cu, Mg, Ru, Cr, Co, Fe, Ni, Pt, Jr, Mo, or their combinations with height of 10-100 nm, and preferably ≥50 nm.

11. The method according to claim 9 wherein said patterning said first or subsequent conductive via layer comprises:

depositing a first or subsequent dielectric hard mask comprising $SiO_2$, SiN, SiON, SiC or SiCN to a thickness of ≥20 nm on said first or subsequent conductive via layer;

spin-coating a photoresist layer on said first or subsequent dielectric hard mask;

patterning said photoresist layer to form photoresist patterns with width of 70-80 nm and height of ≥200 nm; and etching said first or subsequent dielectric hard mask and said first or subsequent conductive via layer with RIE using fluorine carbon or chlorine based plasma alone, or mixed with Ar and $N_2$ or with a physical etch using IBE or RIE with Ar plasma to form metal pillars with height ≥50 nm and width 50-60 nm.

12. The method according to claim 9 wherein said trimming said first or subsequent conductive via layer comprises in-situ or ex-situ IBE trimming at an angle of 70-90° with respect to a normal line of a top surface of said conductive via layer with radio frequency (RF) power of 500-1000 W for 100-500 seconds wherein a pattern size of trimmed said first or subsequent conductive via is ≤30 nm.

13. The method according to claim 12 wherein a vertical etch rate of said IBE trimming is ≤5Å/sec wherein a height of said first or subsequent conductive via is the same as a height of as-deposited said first or subsequent conductive via layer or said height of said first or subsequent conductive via decreases by less than 5 nm from said as-deposited height.

14. The method according to claim 9 wherein said encapsulating said first or subsequent conductive via with said first or subsequent dielectric layer comprises in-situ or ex-situ depositing $SiO_2$, SiN, SiON, SiC, or SiCN having a thickness of ≥50 nm.

15. The method according to claim 9 wherein said patterning said top electrode layer comprises:
   depositing a top dielectric hard mask comprising $SiO_2$, SiN, SiON, SiC or SiCN to a thickness of ≥20 nm on said top electrode layer;
   spin-coating a photoresist layer on said top dielectric hard mask;
   patterning said photoresist layer to form photoresist patterns with width of 70-80 nm and height of ≥200 nm; and
   etching said top dielectric hard mask and said top electrode layer with RIE using fluorine carbon or chlorine based plasma alone, or mixed with Ar and $N_2$ or with a physical etch using IBE or RIE with Ar plasma to form metal pillars with height ≥50 nm and width 50-60 nm.

16. A method for fabricating a magnetic tunneling junction (MTJ) structure comprising:
   forming a first metal layer on a bottom electrode;
   patterning the first metal layer;
   trimming the patterned first metal layer by IBE at an angle of 70-90° with respect to a normal line of a top surface of the patterned first metal layer, the trimming of the patterned first metal layer forming a first conductive via;
   forming a first encapsulation layer over the first conductive via;
   planarizing the first encapsulation layer to expose a top surface of the first conductive via;
   forming a second metal layer on the top surface of the first conductive via;
   patterning the second metal layer;
   trimming the patterned second metal layer by IBE at an angle of 70-90° with respect to a normal line of a top surface of the patterned second metal layer, the trimming of the patterned second metal layer forming a second conductive via;
   forming a second encapsulation layer over the second conductive via;
   planarizing the second encapsulation layer to expose a top surface of the second conductive via;
   forming an MTJ stack over the second conductive via, the MTJ stack including a pinned layer, a tunnel barrier layer, and free layer;
   forming a top electrode over the MTJ stack;
   patterning the top electrode; and
   trimming the patterned top electrode and the MTJ stack by IBE at an angle of 30-60° with respect to a normal line of a top surface of the patterned top electrode, the trimming of the patterned top electrode and the MTJ stack etching side portions of the first and second encapsulation layers without etching the first and second conductive vias.

17. The method of claim 16 wherein the trimming of the patterned first and second metal layers by IBE includes performing in-situ or ex-situ IBE with RF power of 500-1000 W for 100-500 seconds.

18. The method of claim 16 wherein the forming of the first and second encapsulation layers includes depositing a material selected from the group consisting of $SiO_2$, SiN, SiON, SiC, and SiCN.

19. The method of claim 16 wherein the trimming of the MTJ stack forms a tapered MTJ profile having a first critical dimension (CD) at a top portion thereof smaller than a second CD at a bottom portion thereof.

20. The method of claim 19 wherein the first conductive via has a first width less than or equal to 30 nm, wherein the second conductive via has a second width less than or equal to 30 nm, and wherein the second CD is less than or equal to 60 nm.

* * * * *